(12) United States Patent
van Waasen

(10) Patent No.: US 8,213,542 B2
(45) Date of Patent: Jul. 3, 2012

(54) HIGHLY OPTIMIZED DIGITAL IQ TRANSMITTER CHAIN

(75) Inventor: Stefan van Waasen, Kolbermoor (DE)

(73) Assignee: Intel Mobile Communications GmbH, Neubiberg (DE)

(*) Notice: Subject to any disclaimer, the term of this patent is extended or adjusted under 35 U.S.C. 154(b) by 917 days.

(21) Appl. No.: 12/044,814

(22) Filed: Mar. 7, 2008

(65) Prior Publication Data

US 2009/0225903 A1    Sep. 10, 2009

(51) Int. Cl.
*H04L 27/32* (2006.01)
(52) U.S. Cl. ............... 375/316; 375/E7.173; 341/83
(58) Field of Classification Search .......... 375/316, 375/E7.173; 341/83
See application file for complete search history.

(56) References Cited

U.S. PATENT DOCUMENTS

| 4,488,144 | A  | * | 12/1984 | Wollman ............... 341/118 |
| 5,748,680 | A  | * | 5/1998  | Mobin ................. 375/317 |
| 6,417,793 | B1 | * | 7/2002  | Bugeja et al. ......... 341/144 |
| 7,349,677 | B2 | * | 3/2008  | Jensen ................ 455/126 |

* cited by examiner

*Primary Examiner* — Shuwang Liu
*Assistant Examiner* — Michael Neff
(74) *Attorney, Agent, or Firm* — Eschweiler & Associates, LLC

(57) ABSTRACT

Circuitry separates a modulation signal into digital sign and magnitude signal components. The digital magnitude signal is converted to an analog magnitude signal. The analog magnitude signal is the mixed with an in-phase or quadrature carrier signal under the influence of the digital sign signal and routed to a driver output stage.

5 Claims, 8 Drawing Sheets

HIGHLY OPTIMIZED DIGITAL IQ TRANSMITTER CHAIN

BACKGROUND

System-on-chip (SoC) integration on CMOS within wireless systems, in conjunction with the ongoing CMOS shrinkage path, requires appreciable redesign in order to accommodate industry goals. This is especially true for radio frequency (RF) and some analog devices. The result of the continuous march toward integration and miniaturization is that architectures require increased digital circuitry and a reduction in purely analog sub-systems.

Multi-modal radios and other wireless devices present their own challenges in regard to the foregoing paradigm. In particular, respective developments for receivers, synthesizers and transmitters are needed to optimize overall system design. Additional goals in this regard include area savings and reduced current and power consumption. In short, improved SoC design is desirable as applied to wireless and other devices.

Illustrative Background Structures

FIG. 1 shows a transmitter structure (transmitter) 100 in accordance with known techniques. The transmitter 100 shows one approach using polar modulator architecture. The structure 100 includes in-phase-and-quadrature (IQ) to polar conversion circuitry (i.e., or a sub-system) 102. The IQ subsystem 102 receives an in-phase modulation (i.e., intelligence) signal at an input 104 and a quadrature modulation signal at an input 106. The in-phase and quadrature modulation signals are understood to be orthogonal to one another. The IQ subsystem 102 is capable of deriving distinct phase (i.e., angular degrees) and magnitude (i.e., absolute value) signals from the in-phase and quadrature modulation signals. An illustrative magnitude signal S1 is depicted in FIG. 1. Such derived phase-and-magnitude representation of modulation signals is also referred to as polar modulation.

Once the IQ subsystem (i.e., polar modulator) 102 derives the phase and magnitude signals, the phase information is modulated onto a carrier signal 108 by way of time derivative function block 110 and adder 112. A digital phase-lock loop (PLL) 114, being controllably influenced by the modulated carrier signal from adder 112, in turn controls an analog local oscillator (LO) 116. The LO 116 output signal is input to an IQ generator 118, which serves to provide in-phase and quadrature signals corresponding to the modulated carrier signal. Herein, the difference between such in-phase and quadrature signals is generally referred to as a differential signal.

The transmitter 100 also includes a digital-to-analog converter (DAC) 120. The DAC 120 is configured to receive the magnitude signal from the IQ subsystem 102, in digital signal form, and derive a corresponding analog magnitude signal. The analog magnitude signal and the differential signal are mixed at a mixer 122, power amplified by a driver 124 and coupled to one or more antennas 126.

It is noted that within the architecture of transmitter 100, the magnitude (i.e., amplitude) signal S1 is introduced directly to the mixer 122 prior to the driver (i.e., final amplifier) 124 stage. Under this polar modulation structure, especially for a digital implementation, the magnitude signal is always positive (i.e., of consistent polarity) and therefore the current through the mixer (e.g., the mixer 122) is changing with the magnitude without using a steady D.C. (direct current) current draw. This situation corresponds, generally, to class-B operation and shows favorable efficiency.

One challenge in using polar modulation architecture is establishing and maintaining proper synchronism between the phase and magnitude signals. This challenge is becoming more daunting as modulation bandwidths (i.e., information content per unit time) continue to increase in the industry. Illustrative narrowband systems like GSM and Bluetooth are such that polar modulation can be effectively applied without huge efforts. However, other protocols such as W-CDMA (i.e., Wideband Code Division Multiple Access) have requirements that are difficult to achieve. Other system protocols, such as WLAN (i.e., Wireless Local Area Network—IEEE 802.11 standard) or WiMax, have a bandwidth greater than 5 MHz and the respective requirements are extremely difficult to fulfill in mass production or necessitate incredible alignment efforts.

FIG. 2 shows another transmitter 200 in accordance with known techniques. The transmitter 200 includes functional elements (i.e., circuits, or sub-systems) that are analogous to respective elements within the transmitter 100, including a digital phase-lock loop 214, a local oscillator 216, and an IQ generator 218. Transmitter 200 further includes in-phase input node 204 and quadrature input node 206, respectively coupled to in-phase modulation signal S2 and quadrature modulation signal S3.

However, transmitter 200 does not include a polar modulator as was utilized by transmitter 100. Rather, transmitter 200 includes respective DACs 210 and 212. The DAC 210 is configured to receive the in-phase modulation signal from node 204, in digital signal form, and derive a corresponding analog in-phase signal. The analog in-phase signal from the DAC 210 is then mixed with a differential signal provided by the IQ generator 218 using a mixer 220. The mixed signal from mixer 220 is then routed to an adder 222.

In turn, the DAC 212 is configured to receive the quadrature modulation signal from node 206, in digital signal form, and derive a corresponding analog quadrature signal. The analog quadrature signal from the DAC 212 is then mixed with the differential signal provided by the IQ generator 218 using a mixer 224. The mixed signal from mixer 224 is then routed to the adder 222, where it is summed with the other mixed signal from mixer 220 to define a summation signal. The summation signal is then power amplified by a driver 226 and routed to at least one antenna 228.

The transmitter 200 of FIG. 2 utilizes what is referred to as IQ modulation, by virtue of the separate digital-to-analog conversion of both the in-phase and quadrature modulation signals (S2 and S3). IQ modulation is preferred in instances where high modulation bandwidth is to be achieved. However, disadvantages regarding implementation and efficiency under IQ modulation stem from the fact that the in-phase and quadrature modulation signals span respective value ranges having both positive and negative values (i.e., signal polarities). Thus, within an IQ modulation context, the DAC stages require sufficient circuit complexity and operating speed to convert bi-polar input signals. Such requirements can be difficult to achieve, particularly in a mass production environment.

Presently, the most readily employed IQ modulation structures, particularly in a digital implementation, add certain predefined offsets (i.e., biases) before or after the analog-to-digital conversion stage within the respective in-phase and quadrature signal flow paths. An undesirable consequence of this approach is that the advantages and speed of class-B operation no longer exist.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are circuits for use with wireless systems. According to one implementation, an electronic circuit separates a digital modulation signal into a digital sign signal and a digital magnitude signal. A digital-to-analog converter converts the digital magnitude signal into an analog magnitude signal. A mixer then mixes at least the analog in-phase magnitude signal and the digital in phase sign signal to provide a mixed signal.

According to another implementation, an electronic circuit includes elements configured to define a digital-to-analog converter (DAC). The DAC is configured to perform responsive to a multi-state switching signal and an in-phase and quadrature (IQ) differential signal. The circuitry further includes elements cooperatively configured to define a mixer. The mixer receives signals from the DAC, and performs mixing responsive to a digital sign signal. The mixer couples the mixed signal to a pair of output nodes.

According to still another implementation, an electronic circuit includes elements cooperatively configured to define a digital-to-analog converter (DAC). The DAC is configured to perform responsive to a multi-state switching signal and an in-phase and quadrature (IQ) differential signal. The circuit also includes respective elements cooperatively configured to define a mixer. The mixer receives signals from the DAC and performs responsive to a digital sign signal and an inverted form of the digital sign signal. The mixer is configured to provide a mixed signal by way of a pair of output nodes.

In yet another implementation, an electronic circuit includes elements cooperatively configured to define a digital-to-analog converter (DAC). The DAC is configured to perform responsive to a multi-state switching signal, and first and second multiplexed signals. The electronic circuit also includes respective elements cooperatively configured to define a buffer, the buffer coupled to receive signals from the DAC to a pair of output nodes, the buffer configured to perform responsive to a constant reference voltage.

In another implementation, a method includes separating a digital modulation signal into a digital sign signal and a digital magnitude signal. The method also includes converting the digital magnitude signal to an analog magnitude signal. The method further includes mixing at least the analog magnitude signal and the digital sign signal to derive a mixed signal.

Circuit structures provided herein can be fabricated, at least in part, on a common substrate such that respective integrated circuit devices are defined. In one or more implementations, at least a portion of drive circuits presented herein can be fabricated within a 65 nanometer (or smaller) environment.

The techniques described herein may be implemented in a number of ways. One illustrative context is provided below with reference to the included figures and ongoing discussion.

First Illustrative Implementation

Figure 1:
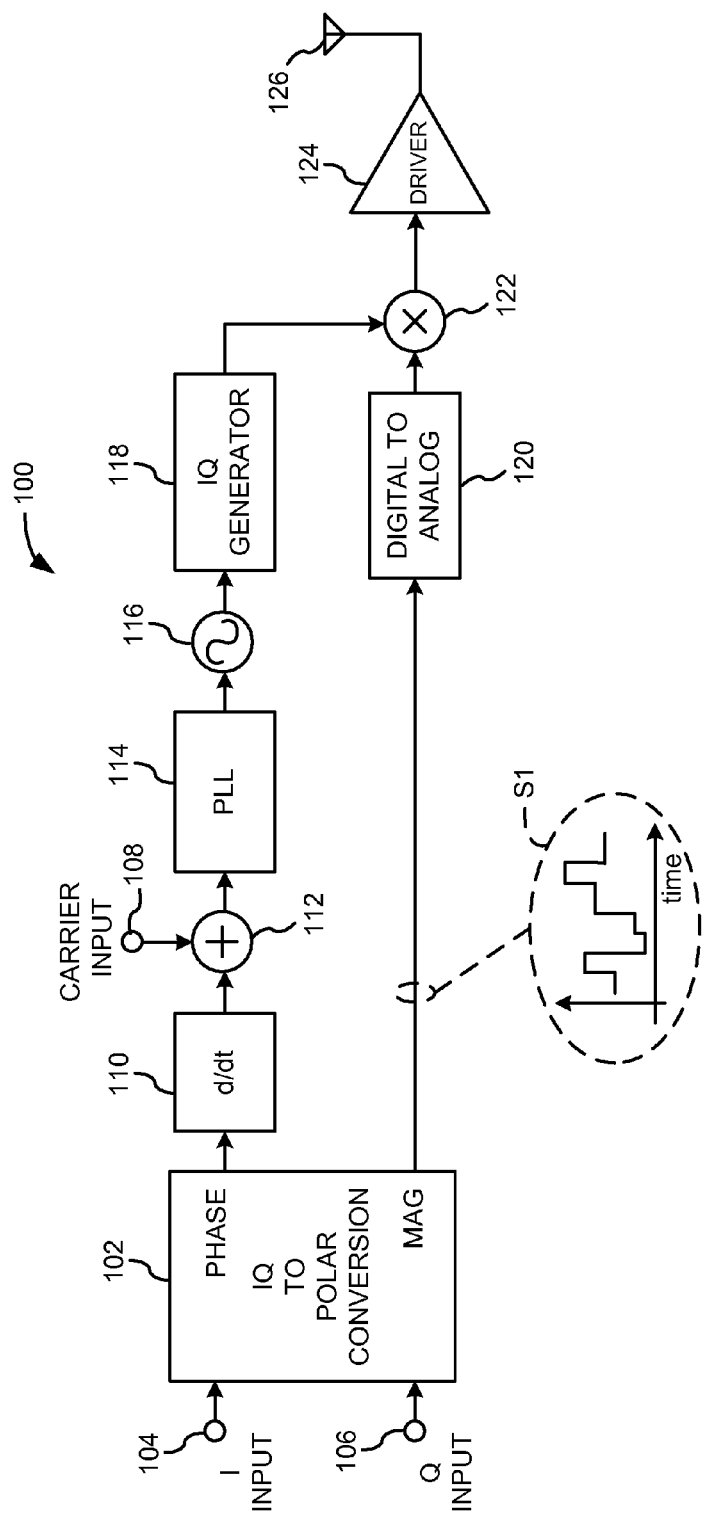
FIG. 1 is a block diagram of a transmitter structure in accordance with known techniques.
Figure 2:
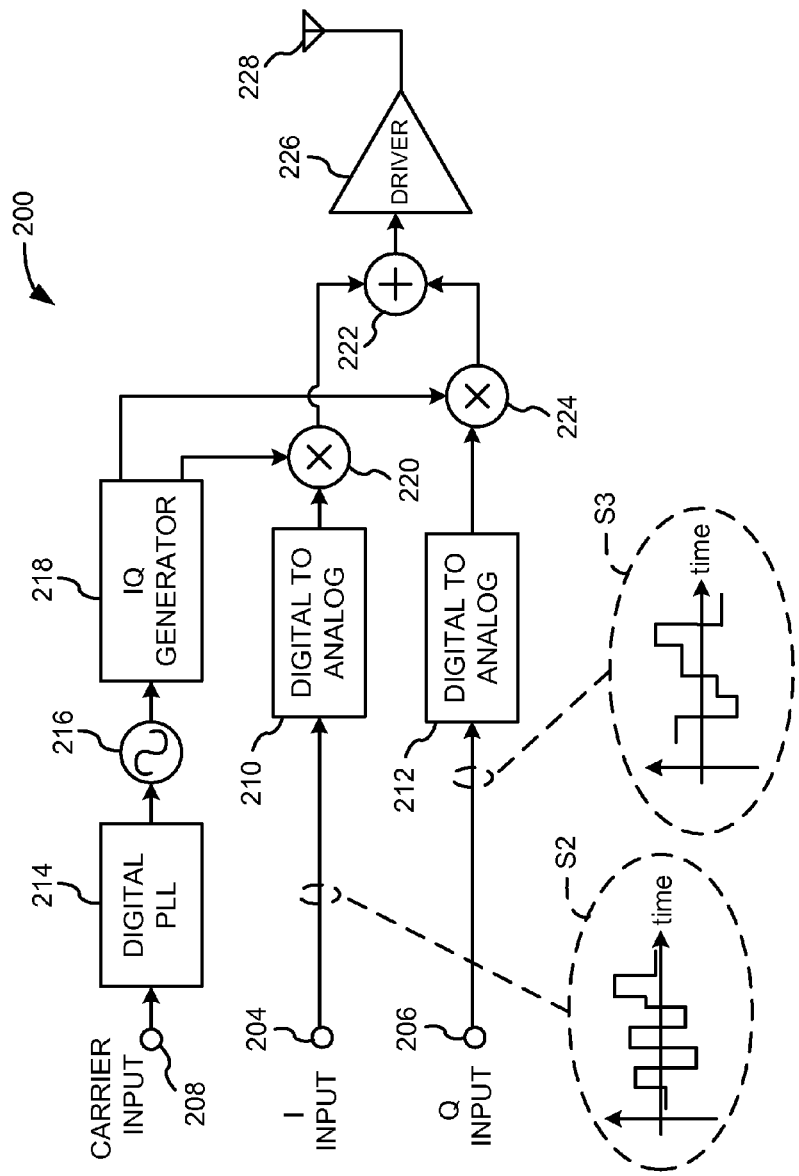
FIG. 2 is a block diagram of another transmitter in accordance with known techniques.
Figure 3:
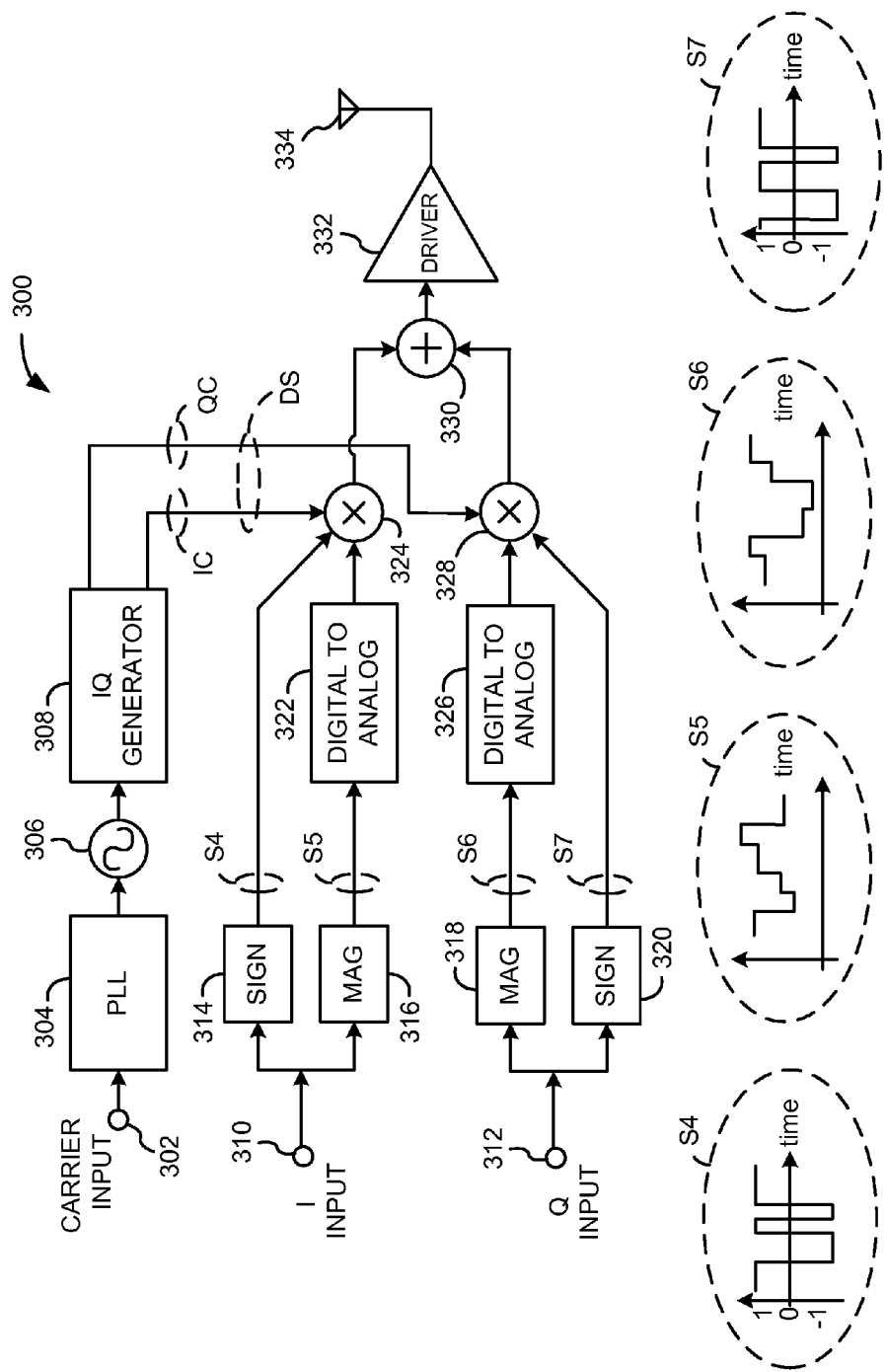
FIG. 3 a block diagram depicting a transmitter structure in accordance with the present teachings.

FIG. 3 depicts an illustrative transmitter structure 300 in accordance with one implementation of the present teachings. The transmitter 300 may be a portion of a transceiver in one or more implementations. The transmitter 300 includes a carrier signal input 302 coupled to a digital phase-lock loop (D-PLL) 304. The D-PLL 304 controls a local oscillator (LO) 306 that provides an input signal to an IQ generator 308. The IQ generator 308, in response to the LO 306 signal, provides an in-phase carrier signal (IC) and a quadrature carrier signal (QC), wherein the difference between these two signals is referred to as a differential signal (DS). In this way, the differential signal DS produced by the IQ generator 308 corresponds to the carrier signal received at input 302.

The transmitter 300 also includes in-phase modulation signal input 310 and quadrature modulation signal input 312. Circuitry 314 derives a digital in-phase sign signal S4 from the in-phase modulation signal. In turn, circuitry 316 derives a digital in-phase magnitude signal S5 from the in-phase modulation signal. Additionally, circuitry 318 derives a digital quadrature magnitude signal S6 from the quadrature modulation signal, while circuitry 320 derives a digital quadrature sign signal S7 from the quadrature modulation signal.

The transmitter 300 also includes a digital-to-analog converter (DAC) 322. The DAC 322 receives the digital in-phase magnitude signal S5 from circuitry 316 and derives an analog in-phase magnitude signal. The analog in-phase magnitude signal is then mixed with the in-phase carrier signal IC from the IQ generator 308, and the digital in-phase sign signal S4, using a mixer 324 so as to derive a mixed signal.

The transmitter 300 further includes another digital-to-analog converter (DAC) 326. The DAC 326 receives the digital quadrature magnitude signal S6 from circuitry 318 and derives a corresponding analog quadrature magnitude signal. This analog quadrature magnitude signal is then mixed with the quadrature carrier signal QC from the IQ generator 308, and the digital quadrature sign signal S7, using a mixer 328 to derive another mixed signal. Both of the mixed signals—from mixers 324 and 328, respectively—are coupled to an adder 330. The adder 330 sums the two mixed signals and provides a summation signal to a driver 332, which in turn drives one or more antennas 334.

The transmitter 300 bases its operation on the separation of sign and magnitude information (i.e., signals) from the respective in-phase and quadrature modulation signal inputs (at 310 and 312). Thereafter, representative sign (digital) and magnitude (analog) signals are recombined at respective mixer stages (324 and 328), along with in-phase (IC) and quadrature (QC) signals corresponding to the carrier wave. In this way, transmitter 300 assures that only positive (i.e., single polarity) signals are input to, and converted by, the respective DACs 322 and 326. Furthermore, the transmitter 300 exhibits class-B operation (or nearly so) at the driver stage 332, thus performing with desirable efficiency and overall operating speed.

Second Illustrative Implementation

Figure 4:
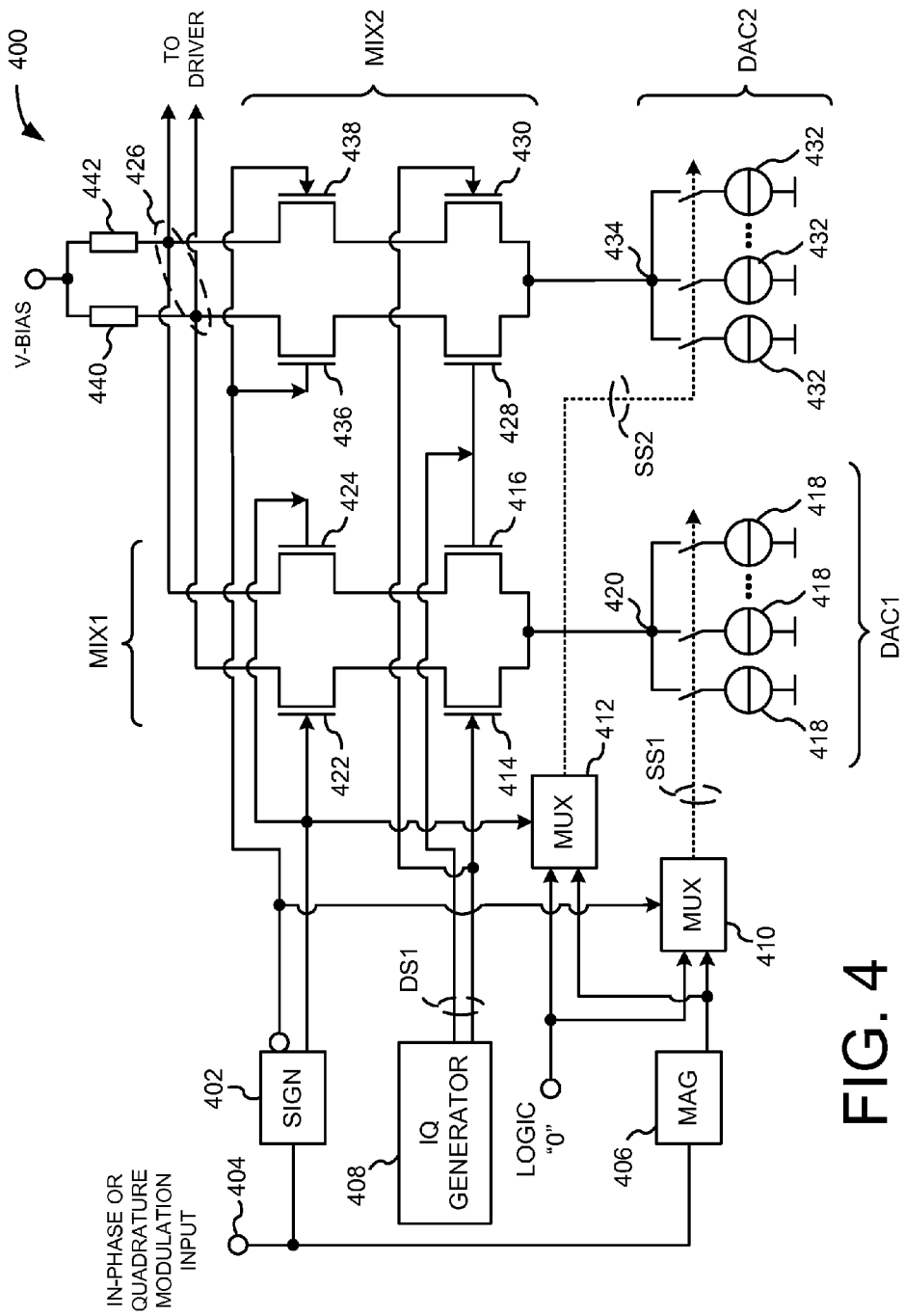
FIG. 4 is a block schematic diagram depicting electronic circuitry in accordance with the present teachings.

FIG. 4 is a block schematic diagram depicting electronic circuitry (i.e., circuitry) 400 in accordance with the present teachings. One having ordinary skill in the pertinent arts can appreciate that other functional elements respectively taught herein and/or known in the art can be used in combination with the electronic circuitry 400. However, such other functional elements are omitted from FIG. 4 in the interest of simplicity and clarity of understanding.

The circuitry 400 includes circuitry (i.e., functional block) 402 configured to receive either a digital in-phase or digital quadrature modulation signal from input 404. In turn, the block 402 derives (i.e., provides) a digital sign signal and an inverted form of the digital sign signal, in accordance with the instantaneous polarity of the input modulation signal. The circuitry 400 also includes other circuitry (i.e., another functional block) 406 configured to receive the same digital in-phase or digital quadrature modulation signal from input 404. In turn, the functional block 406 derives (i.e., provides) a digital magnitude signal corresponding to the input modulation signal.

The circuitry 400 also includes an IQ generator 408 configured to receive a carrier signal from a local oscillator (not shown; refer to 306 of FIG. 3) and to provide an analog in-phase carrier signal and an analog quadrature carrier signals. The difference between the in-phase and quadrature carrier signals is referred to as a (analog) differential signal DS1.

The circuitry 400 includes a multiplexer (MUX) 410. The MUX 410 is configured to receive the digital magnitude signal from block 406, the inverted digital sign signal from block 402, and a logic level 'zero' reference signal. The MUX 410 is further configured to provide a multi-state switching signal SS1 corresponding to a predetermined function of the magnitude, logic zero, and inverted sign input signals. As such, the MUX 410 can be considered to be a state machine having three input signals and one multi-state output signal. Further elaboration regarding the MUX 410 and the signal SS1 is provided hereinafter.

The circuitry 400 further includes another multiplexer (MUX) 412. The MUX 412 is configured to receive the digital magnitude signal from block 406, the digital sign signal from block 402, and the logic level 'zero' reference signal. The MUX 412 is further configured to provide a multi-state switching signal SS2 corresponding to a predetermined function of the magnitude, logic zero and sign input signals. As such, the MUX 412 can also be considered to be a state machine having three input signals and one multi-state output signal.

The circuitry 400 also includes a first transistor 414, a second transistor 416, and a plurality of selectably switchable current sources (current sources) 418. The transistors 414 and 416 and the plurality of current sources 418 cooperatively define a digital-to-analog converter DAC1. That is, elements 414, 416 and 418 collectively function so as to provide digital-to-analog signal conversion. The DAC1 is configured to derive an analog magnitude signal corresponding to the digital magnitude signal from block 406, under the controlling influence of differential signal DS1 and the multi-state switching signal SS1.

Each of the current sources 418 can be configured to provide any respectively suitable current value. In one non-limiting implementation, all of the current sources 418 are configured to provide a common electrical current value (e.g., all provide 0.01 mA, etc.). In another non-limiting implementation, the current sources 418 are respectively configured to provide unique electrical currents such that the overall plurality exhibits constant steps therebetween (e.g., one current source at each of 0.01 mA, 0.02 mA, 0.03 mA . . . , etc.). Other weighting schemes can also be used (linear weighting, binary weighting, logarithmic weighting, etc.). Thus, the current sources 418 can be individually weighted so that, through selective switching, any practical combination of electrical currents can be summed at node 420. In any case, the selective switching of current sources 418 to the node 420 is accomplished by way of the multi-state switching signal SS1. While a total of three current sources 418 are depicted, it is to be understood that any suitable number of current sources 418 can be included in accordance with the resolution of the signal conversion to be performed by DAC1.

The circuitry 400 also includes a third transistor 422 and a fourth transistor 424 cooperatively configured to define a mixer MIX1. The mixer MIX1 is configured to mix the analog magnitude signal provided by DAC1 with the digital sign signal and inverted digital sign signal provided by block 402. The mixer MIX1 then provides the resulting mixed signal to a pair of nodes 426.

The circuitry 400 also includes a fifth transistor 428, a sixth transistor 430, and another plurality of selectably switchable current sources (current sources) 432. The transistors 428 and 430 and the plurality of current sources 432 cooperatively define another digital-to-analog converter DAC2. Thus, elements 428, 430 and 432 collectively function so as to provide digital-to-analog signal conversion. The DAC2 is configured to derive an analog magnitude signal corresponding to the digital magnitude signal from block 406, under the controlling influence of differential signal DS1 and the multi-state switching signal SS2.

Each of the selectable current sources 432 can be defined to provide any respectively suitable current value. As such, any suitable weighting scheme can be used (linear weighting, binary weighting, logarithmic weighting, etc.). Thus, the current sources 432 can be individually weighted so that, through selective switching, any practical combination of electrical currents can be summed at node 434. The selective switching of current sources 432 to the node 434 is accomplished by way of the multi-state switching signal SS2. While a total of three current sources 432 are depicted, it is to be understood that any suitable number of current sources 432 can be included in accordance with the resolution of the signal conversion to be performed by DAC2.

The circuitry 400 further includes a seventh transistor 436 and an eighth transistor 438 cooperatively configured to define a mixer MIX2. The mixer MIX2 is configured to mix the analog magnitude signal provided by DAC2 with the digital sign signal and inverted digital sign signal provided by block 402. The mixer MIX2 then provides the resulting mixed signal to the pair of nodes 426. The nodes 426 are coupled to the source of bias potential V-BIAS by way of respective resistors 440 and 442. The nodes 426—also referred to as output nodes—are understood to be coupled or coupleable to a driver or other suitable stage (e.g., driver 332 of FIG. 3).

In operation, the circuitry 400 cross-switches between independent stages, wherein stage 1 includes DAC1 and MIX1, and stage 2 includes DAC2 and MIX2, respectively. Such cross-switching between stages 1 and 2 is performed in accordance with the assertion of the digital sign signal or inverted form of the digital sign signal, respectively. Specifically, when the sign signal provided by block 402 is asserted, then the mixed signal provided by MIX1 is routed to node pair 426. Conversely, when the inverted form of the sign signal provided by block 402 is asserted, then the mixed signal provide by MIX2 is coupled to node pair 426. In other words, an assertion of either the sign signal or the inverted form of the sign signal determines which of the two stages is active at any particular instant. In this way, the circuitry 400 handles both positive and negative polarities of the input modulation signal at node 404, while facilitating class-B operation (or nearly so) at the output signal driver stage (not shown).

The circuitry 400 can be implemented in any number of suitable implementations. In one non-limiting implementation, some or all of the circuitry 400 can be implemented as an integrated circuit. In another non-limiting implementation, some or all of the circuitry 400 can be implemented within a 65 nanometer environment. In yet another non-limiting implementation, some or all of the circuitry 400 is implemented via one or more discrete electronic components. Other implementations of the circuitry 400, or a portion thereof, can also be used.

Third Illustrative Implementation

Figure 5:
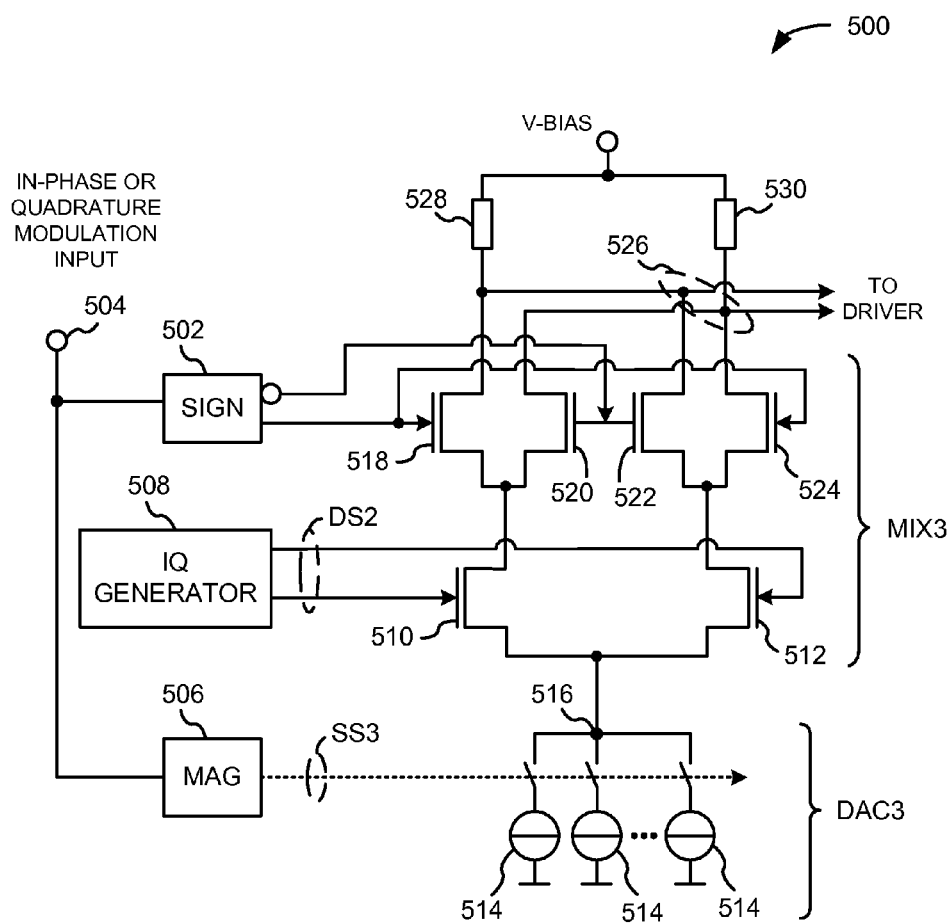
FIG. 5 is a block schematic diagram depicting electronic circuitry in accordance with the present teachings.

FIG. 5 is a block schematic diagram depicting electronic circuitry (i.e., circuitry) 500 in accordance with the present teachings. One having ordinary skill in the pertinent arts can appreciate that other functional elements respectively taught herein and/or known in the art can be used in combination with the electronic circuitry 500. However, such other functional elements are omitted from FIG. 5 in the interest of simplicity and clarity of understanding.

The circuitry 500 includes circuitry (i.e., functional block) 502 configured to receive either a digital in-phase modulation signal or a digital quadrature modulation signal from input 504. In turn, the block 502 derives (i.e., provides) a digital sign signal and an inverted form of the digital sign signal, in accordance with the instantaneous polarity of the input modulation signal. The circuitry 500 also includes other circuitry (i.e., another functional block) 506 configured to receive the same digital in-phase or digital quadrature modulation signal from input 504. In turn, the functional block 506 derives (i.e., provides) a multi-state switching signal SS3, the state of which corresponds to the magnitude of the digital modulation signal received from input 504.

The circuitry 500 also includes an IQ generator 508 configured to receive a carrier signal from a local oscillator (not shown; refer to 306 of FIG. 3) and to provide an analog in-phase carrier signal and an analog quadrature carrier signal. The difference between the in-phase and quadrature carrier signals is referred to as (analog) differential signal DS2.

The circuitry 500 also includes a first transistor 510, a second transistor 512, and a plurality of selectably switchable current sources (current sources) 514. The transistors 510 and 512 and the plurality of current sources 514 cooperatively define a digital-to-analog converter DAC3. The DAC3 is configured to convert the multi-state switching signal SS3—which corresponds to the magnitude of the digital modulation signal input at 504—into a corresponding analog magnitude signal under the controlling influence of the differential signal DS2.

Each of the current sources 514 can be configured to provide any suitable current value. In one non-limiting implementation, all of the current sources 514 are configured to provide a common electrical current value (e.g., 0.01 mA, etc.). In another non-limiting implementation, the current sources 514 are respectively configured such that the overall plurality exhibits constant steps therebetween (e.g., 0.01 mA, 0.02 mA, 0.03 mA . . . , etc.). Other weighting schemes can also be used (linear weighting, binary weighting, logarithmic weighting, etc.). The current sources 514 may be individually weighted so that, through selective switching, any practical combination of electrical currents can be summed at node 516. The selective switching of current sources 514 to the node 516 is accomplished by way of the multi-state switching signal SS3. While three current sources 514 are depicted, it is to be understood that any suitable number of current sources 514 may be included in accordance with the resolution of the signal conversion to be performed by DAC3.

The circuitry 500 also includes a third transistor 518, a fourth transistor 520, a fifth transistor 522, and a sixth transistor 524 cooperatively configured to define a mixer MIX3. The mixer MIX3 is configured to mix the analog magnitude signal provided by DAC3 with the digital sign signal and inverted digital sign signal provided by block 502. The mixer MIX3 then provides the resulting mixed signal to a pair of nodes 526. The nodes 526 are coupled to the source of bias potential V-BIAS by way of respective resistors 528 and 530. The nodes 526—also referred to as output nodes—are understood to be coupled or coupleable to a driver or other suitable stage (e.g., driver 332 of FIG. 3).

In operation, the circuitry 500 effectively changes the sign of the analog magnitude signal by cross-switching the paths from the DAC3 to the nodes 526 by way of the mixer MIX3. This cross-switching is performed in accordance the instantaneous state of the digital sign signal and the inverted form of the digital sign signal as provided by block 502. Thus, mixing is substantially achieved by way of selectively connecting or cross-connecting the analog output from DAC3 to the output nodes 526. In this way, the circuitry 500 handles both positive and negative polarities of the input modulation signal by way of a single digital-to-analog conversion stage, DAC3.

The circuitry 500 may be implemented in any number of suitable implementations. In one non-limiting implementation, some or all of the circuitry 500 can be implemented as an integrated circuit. In another non-limiting implementation, some or all of the circuitry 500 can be implemented within a 65 nanometer environment. In yet another non-limiting implementation, some or all of the circuitry 500 is implemented via one or more discrete electronic components. Other implementations including the circuitry 500, or a portion thereof, can also be used.

Fourth Illustrative Implementation

Figure 6:
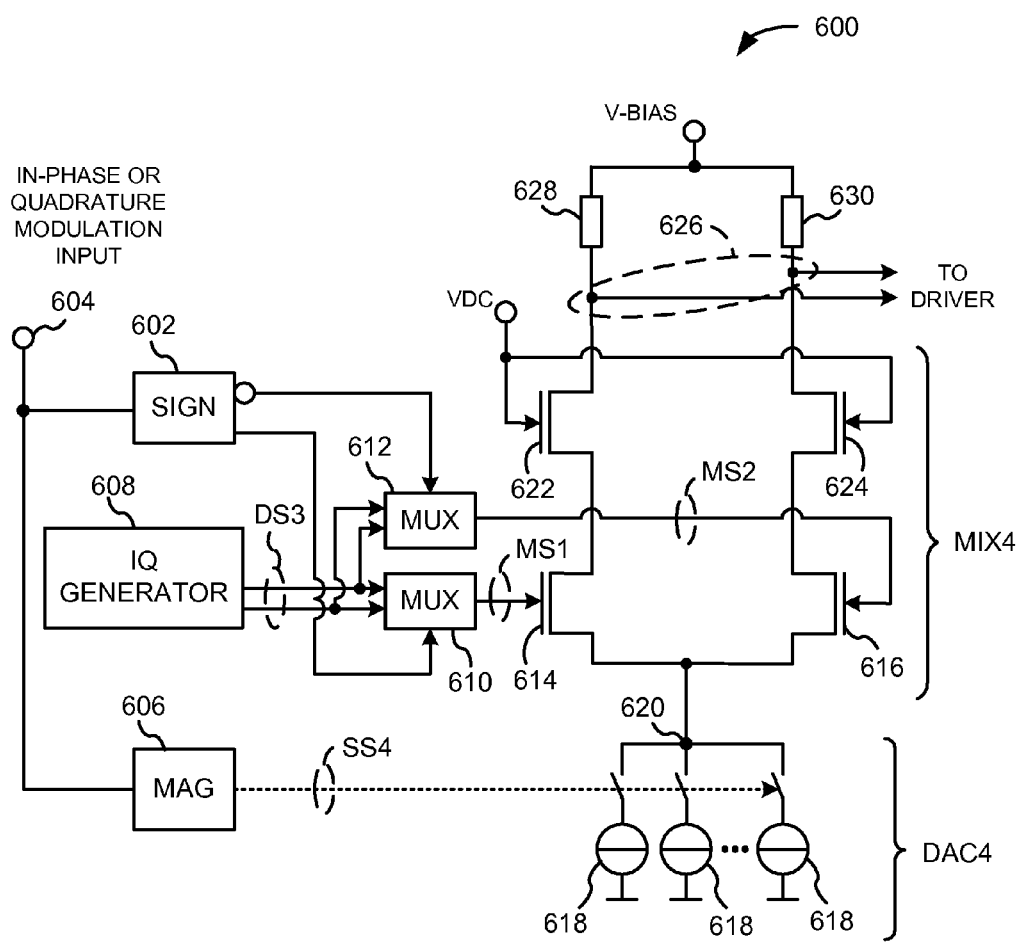
FIG. 6 is a block schematic diagram depicting electronic circuitry in accordance with the present teachings.

FIG. 6 is a block schematic diagram depicting electronic circuitry (i.e., circuitry) 600 in accordance with the present teachings. One having ordinary skill in the pertinent arts can appreciate that other functional elements respectively taught herein and/or known in the art can be used in combination with the electronic circuitry 600. However, such other functional elements are omitted from FIG. 6 in the interest of clarity of understanding.

The circuitry 600 includes circuitry (i.e., functional block) 602 configured to receive either a digital in-phase modulation signal or digital quadrature modulation signal from input 604. In turn, the block 602 derives (i.e., provides) a digital sign signal and an inverted form of the digital sign signal, in accordance with the instantaneous polarity of the input modulation signal. The circuitry 600 also includes other circuitry (i.e., another functional block) 606 configured to receive the same digital in-phase or digital quadrature modulation signal from input 604. In turn, the functional block 606 derives (i.e., provides) a multi-state switching signal SS4, the state of which corresponds to the magnitude of the digital modulation signal received from input 604.

The circuitry 600 also includes an IQ generator 608 configured to receive a carrier signal from a local oscillator (not shown; refer to 306 of FIG. 3) and to provide an analog in-phase carrier signal and an analog quadrature carrier signal, the difference between the two signals being referred to as a differential signal DS3.

The circuitry 600 includes a multiplexer (MUX) 610. The MUX 610 is configured to receive the analog differential signal DS3 and the digital sign signal from block 602. The MUX 610 is further configured to provide a multiplexed signal MS1. As such, the MUX 610 can be considered to be a state machine having three input signals and one output signal. The circuitry 600 also includes another multiplexer (MUX) 612. The MUX 612 is configured to receive the analog differential signal DS3 and the inverted form of the digital sign signal from block 602. The MUX 612 is further configured to provide a multiplexed signal MS2. As such, the MUX 612 can also be considered to be a state machine having three input signals and one output signal.

The circuitry 600 also includes a first transistor 614, a second transistor 616, and a plurality of selectably switchable current sources (current sources) 618. The transistors 614 and 616 and the plurality of current sources 618 cooperatively define a digital-to-analog converter DAC4. The DAC4 is configured to convert the multi-state switching signal SS4 into a corresponding analog magnitude signal under the controlling influence of the multiplexed signals MS1 and MS2. It is noted that the digital sign signal and inverted form of the digital sign signals from block 602 are included in the multiplexed signals MS1 and MS2. As a result, effective mixing with the sign and inverted sign signals—in accordance with their respectively asserted or non-asserted states—is also accomplished within the DAC4 stage of circuitry 600.

Each of the current sources 618 can be configured to provide any suitable current value. In one non-limiting implementation, all of the current sources 618 are configured to provide a common electrical current value (e.g., 0.01 mA, etc.). In another non-limiting implementation, the current sources 618 are respectively configured such that the overall plurality exhibits constant steps therebetween (e.g., 0.01 mA, 0.02 mA, 0.03 mA . . . , etc.). Other weighting schemes can also be used (linear weighting, binary weighting, logarithmic weighting, etc.). The current sources 618 can be individually weighted so that, through selective switching, any practical combination of electrical currents can be summed at node 620. The selective switching of current sources 618 to the node 620 is accomplished by way of the multi-state switching signal SS4. While three current sources 618 are depicted, it is to be understood that any suitable number of current sources 618 can be included in accordance with the resolution of the signal conversion to be performed by DAC4.

The circuitry 600 also includes a third transistor 622 and a fourth transistor 624. Respective control nodes (i.e., gates) of the transistors 622 and 624 are coupled to a source of direct current (D.C.) potential VDC. The transistors 622 and 624 cooperatively buffer the analog signal derived by DAC4 to a pair of output nodes 626. The nodes 626 are coupled to a source of bias potential V-BIAS by way of respective resistors 628 and 630. The nodes 626, also referred to as output nodes, are understood to be coupled or coupleable to a driver or other suitable stage (e.g., driver 332 of FIG. 3).

In operation, the circuitry 600 effectively includes the sign signal, derived from the modulation input signal, within the local oscillator (LO) signal pathway by way of the IQ generator 608 and the MUXs 610 and 612. In this way, only one digital-to-analog conversion stage is used (i.e., DAC4), but the timing of the switching (in accordance with the assertion of the sign and inverted sign signals) must be performed as closely as possible to the zero crossing of the LO signal.

The circuitry 600 can be implemented in any number of suitable implementations. In one non-limiting implementation, some or all of the circuitry 600 can be implemented as an integrated circuit. In another non-limiting implementation, some or all of the circuitry 600 can be implemented within a 65 nanometer environment. In yet another non-limiting implementation, some or all of the circuitry 600 is implemented via one or more discrete electronic components. Other implementations including the circuitry 600, or a portion thereof, can also be used.

Illustrative Method

Figure 7:
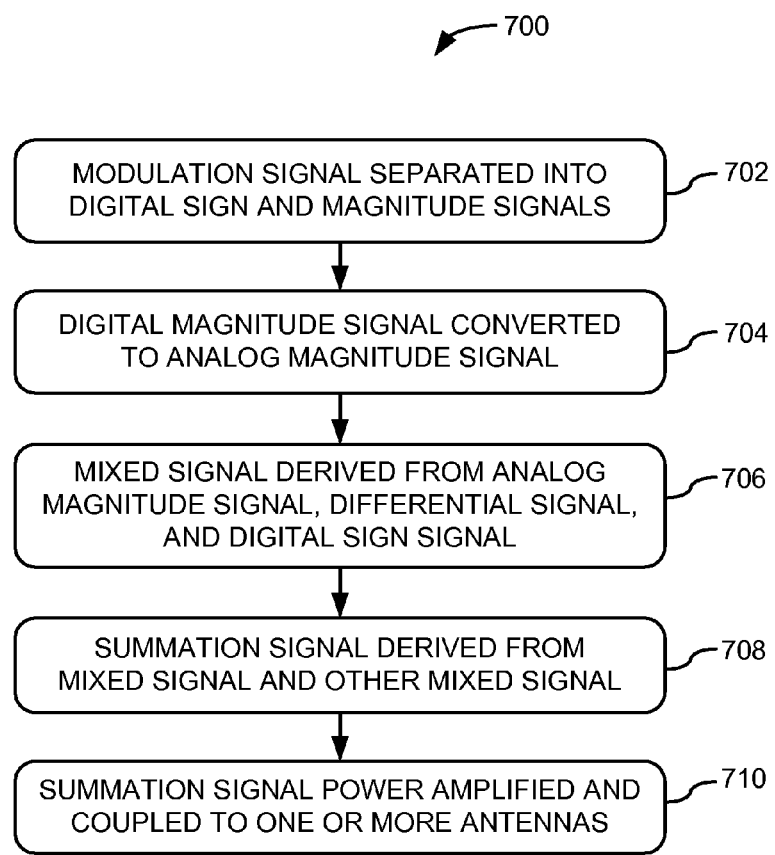
FIG. 7 is a flow diagram depicting a method in accordance with the present teachings.

FIG. 7 is a flow diagram 700 depicting a method in accordance with the present teachings. The method 700 depicts particular steps in a particular order of execution. However, certain steps can be omitted or other steps added, and/or other orders of execution can also be performed, without departing from the scope of the present teachings. The method 700 depicts a flow of distinct and discrete events in the interest of clarity of understanding. However, one of skill in the relevent arts can appreciate that the method 700 can operate in an essentially continuous manner, such that signals flow smoothly from one step to the next during processing.

At 702, a digital modulation signal is separated into digital sign and digital magnitude signals (i.e., derived components). For purposes of non-limiting example, it is assumed that a digital in-phase modulation signal is subject to the described separation, thus resulting in a digital in-phase sign signal and a digital in-phase magnitude signal. Other digital modulation signals, having respectively varying relationships to other digital modulations signals, can also be used.

At 704, the digital magnitude signal is converted to an analog magnitude signal. In one or more implementations, such digital-to-analog (D-to-A) conversion can be performed by way of known means. In one or more other implementations, the D-to-A conversion is done by way of particular circuit means presented herein. For purposes of the ongoing example, it is assumed that analog magnitude signal is derived from the digital in-phase magnitude signal.

At 706, the analog magnitude signal is mixed with the corresponding digital sign signal and a differential signal. The differential signal is typically defined by the difference between in-phase carrier and quadrature carrier signals. Thus, both in-phase and quadrature carrier signals can be used in order to realize the differential. However, other differential signals can be used. In another implementation, only the analog magnitude signal and the digital sign signal are used, and the differential signal (or components thereof) is/are not involved in the mixing. In any case, a mixed signal is derived.

At 708, the mixed signal from 706 above is added to another mixed signal to derive a summation signal. The other mixed signal can be derived by way of other, simultaneous processing of other signals according to 702-706 above. For purposes of ongoing example, it is assumed that an analog quadrature magnitude signal is mixed with (at least) a corresponding digital quadrature sign signal in order to derive the other mixed signal.

At 710, the summation signal is power amplified and provided to one or more antennas for broadcast.

Illustrative Device

Figure 8:
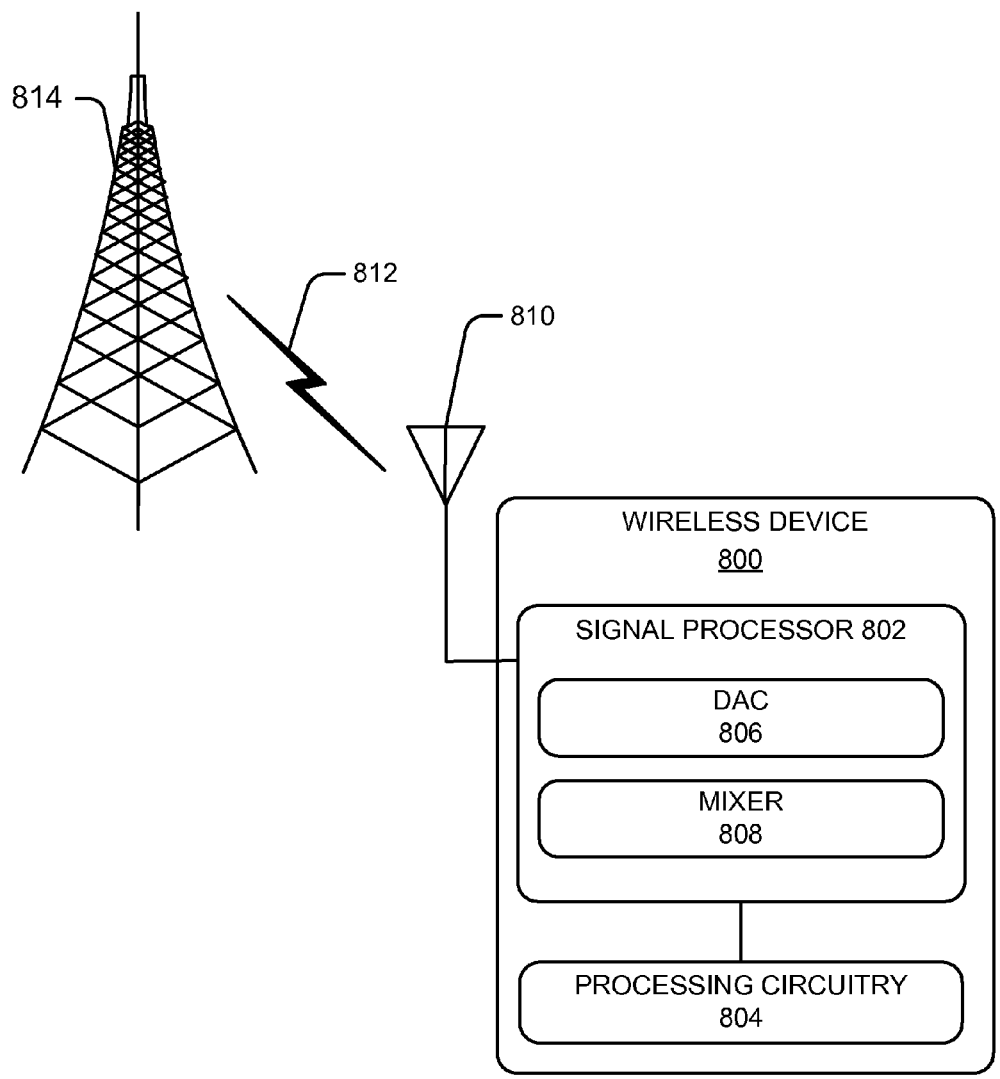
FIG. 8 is a diagram illustrating a wireless device.

FIG. 8 illustrates one implementation of a wireless device 800 that incorporates the circuitry described above with regard to FIGS. 3-6. Wireless device 800 includes a signal processor 802, which may be connected to processing circuitry 804 or other electronic circuitry associated with the wireless device 800. The signal processor 802 is operable to separate a digital modulation signal into a digital sign signal and a digital magnitude signal. A digital-to-analog converter 806 converts the digital magnitude signal into an analog magnitude signal. A mixer 808 then mixes at least the analog magnitude signal and the digital sign signal to provide a mixed signal. An exemplary signal processor 802 may include, for example, transmitter 300, circuitry 400, and so forth. Signal processor 802 is shown simplified for illustration purposes and may include other components, such as drivers, PLLs, and so forth, for processing and transmitting a modulated signal.

Wireless device 800 may have one or more antennas 810 for sending and receiving signals 812 to and from one or more communication bases 814 using one or more modes. Some exemplary types of modes may include a Global System for Mobile communications (GSM) mode, a Universal Mobile Telecommunications System (UMTS) mode, a Third Generation Partnership Project Long Term Evolution (3GPP LTE) mode, a Worldwide Interoperability for Microwave Access (WiMax) mode, a Wireless Local Area Network (WLAN) mode, a Bluetooth (BT) mode, and so forth. Communication base 814 is shown as a base station 814, such as a cellular communications tower; however, it is intended that the communication base could additionally or alternatively include a satellite, a wireless access point (WAP), Bluetooth (BT) headset, and/or other commutation device.

The wireless device 800 may be or include a cellular phone, wireless media device, a global positioning system (GPS) receiver, or other device capable of receiving and/or transmitting a radio or other wireless signal 812. For example, the wireless device 800 may be a personal digital assistant (PDA), a portable computing device capable of wireless communication, a media player device, a portable gaming device, a personal computer, a wireless access point (WAP) and/or any other suitable device.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. An electronic circuit, comprising:
 a digital-to-analog converter, the digital-to-analog converter configured to convert a digital magnitude signal derived from a digital modulation signal into an analog magnitude signal responsive to a multi-state switching signal;
 a mixer, the mixer coupled to receive signals from the digital-to-analog converter and the mixer configured to mix at least a digital sign signal derived from the digital modulation signal with the analog magnitude signal, responsive to an in-phase-and-quadrature (IQ) differential signal to produce a mixed signal that is provided to a pair of output nodes; and
 a multiplexer configured to receive the digital magnitude signal and an inverted form of the digital sign signal and a logic reference signal and derive the multi-state switching signal there from.

2. The electronic circuit according to claim 1, wherein the IQ differential signal is defined by a difference between an analog in-phase carrier signal and an analog quadrature carrier signal.

3. The electronic circuit according to claim 1, wherein the digital-to-analog converter is a first digital-to-analog converter, the multi-state switching signal is a first multi-state switching signal, the mixer is a first mixer, and the mixed signal is a first mixed signal, the electronic circuit further comprising:
 a second digital-to-analog converter configured to convert the digital magnitude signal into a second analog magnitude signal responsive to a second multi-state switching signal and the in-phase-and-quadrature (IQ) differential signal; and
 a second mixer coupled to receive signals from the second digital-to-analog converter and to mix at least an inverted form of the digital sign signal with the second analog magnitude signal to provide a second mixed signal by way of the pair of output nodes.

4. The electronic circuit according to claim 3, further comprising a multiplexer configured to receive the digital magnitude signal and the digital sign signal and a logic reference signal and derive the second multi-state switching signal there from.

5. An electronic circuit, comprising:
 a digital-to-analog converter, the digital-to-analog converter configured to convert a digital magnitude signal derived from a digital modulation signal into an analog magnitude signal responsive to a multi-state switching signal; and
 a mixer coupled to receive signals from the digital-to-analog converter and configured to mix a digital sign signal and an inverted form of the digital sign signal derived from the digital modulation signal with the analog magnitude signal responsive to an in-phase-and-quadrature (IQ) differential signal to produce a mixed signal that is provided by way of a pair of output nodes, the IQ differential signal being defined by a difference between an analog in-phase carrier signal and an analog quadrature carrier signal and the multi-state switching signal corresponding to the digital magnitude signal.

* * * * *